(12) United States Patent
Fukuoka et al.

(10) Patent No.: US 7,145,818 B2
(45) Date of Patent: Dec. 5, 2006

(54) SEMICONDUCTOR INTEGRATED CIRCUIT DEVICE HAVING TEST CIRCUIT

(75) Inventors: Tetsuya Fukuoka, Hamura (JP); Mikio Yamagishi, Iruma (JP)

(73) Assignee: Hitachi, Ltd., Tokyo (JP)

( * ) Notice: Subject to any disclaimer, the term of this patent is extended or adjusted under 35 U.S.C. 154(b) by 225 days.

(21) Appl. No.: 10/806,417

(22) Filed: Mar. 23, 2004

(65) Prior Publication Data
US 2004/0213050 A1 Oct. 28, 2004

(30) Foreign Application Priority Data
Mar. 28, 2003 (JP) ............................. 2003-091518

(51) Int. Cl.
*G11C 29/30* (2006.01)

(52) U.S. Cl. .................. 365/201; 365/189.05; 326/16; 326/46; 327/202; 714/726

(58) Field of Classification Search ..................... None
See application file for complete search history.

(56) References Cited

U.S. PATENT DOCUMENTS

| | | | | |
|---|---|---|---|---|
| 5,654,658 A | * | 8/1997 | Kubota et al. | 327/202 |
| 5,701,307 A | * | 12/1997 | Whetsel | 714/29 |
| 5,938,783 A | * | 8/1999 | Whetsel | 714/726 |
| 6,429,713 B1 | * | 8/2002 | Nakaizumi | 327/218 |
| 6,536,003 B1 | * | 3/2003 | Gaziello et al. | 714/710 |
| 6,560,150 B1 | * | 5/2003 | Abedifard | 365/201 |

* cited by examiner

*Primary Examiner*—Son L. Mai
(74) *Attorney, Agent, or Firm*—Miles & Stockbridge P.C.

(57) ABSTRACT

A semiconductor integrated circuit device is provided with a diagnosis circuit, which does not increase the delay of a logic element in normal operation. In a latch provided at the output of a memory or at the input of a logic stage, a signal selector is provided in the feedback loop of the latch. The selector is switched in correspondence with the operation mode, such that it transfers the feedback signal in normal operation, while it transfers the test signal in a test mode, in order to prevent the delay from increasing in the signal selector on the main path in normal operation.

2 Claims, 5 Drawing Sheets

SEMICONDUCTOR INTEGRATED CIRCUIT DEVICE HAVING TEST CIRCUIT

CLAIM OF PRIORITY

The present application claims priority from Japanese application JP 2003-091518 filed on Mar. 28, 2003, the content of which is hereby incorporated by reference into this application.

FIELD OF THE INVENTION

The present invention relates to a semiconductor integrated circuit device, and, more particularly, to a technology used in the diagnostic testing of a semiconductor integrated circuit device having for example, a logic circuit and a memory circuit.

BACKGROUND OF THE INVENTION

A scan test of a large scaled integration semiconductor device (LSI) is performed using a combination of sequential circuits including a flip-flop (abbreviated to FF herein after) and a latch. It is not recommended to process a number of memory cells contained in the memory like the FFs and latches. This is because the number of FFs and latches becomes too much for a scan.

Figure 7A:
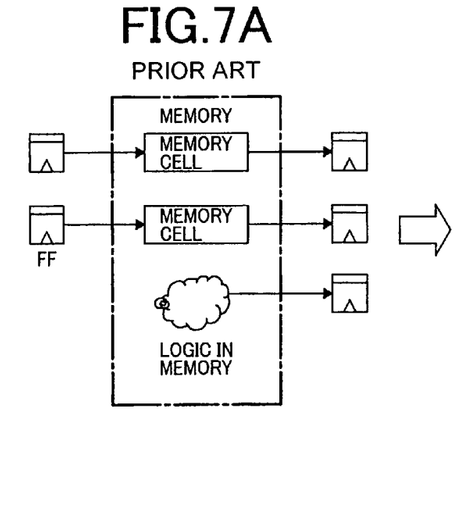
FIGS. 7A and 7B are schematic diagrams illustrating a function test of a memory and a logic, proposed prior to the present invention.
Figure 7B:
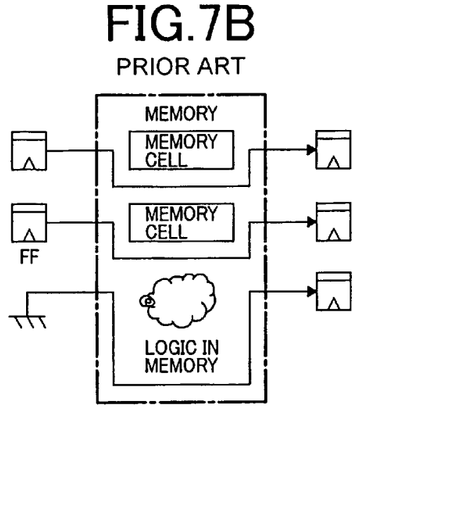
Figure 8:
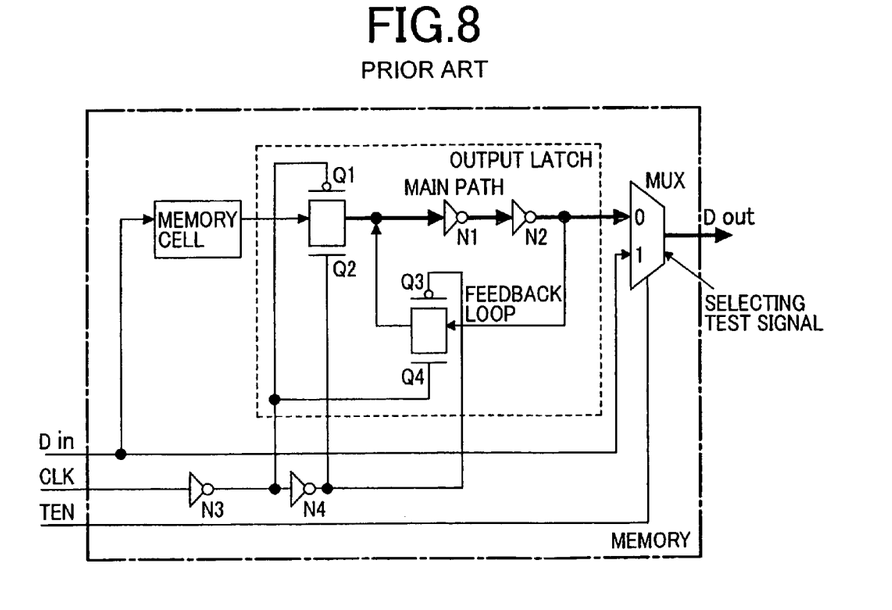
FIG. 8 is a schematic circuit diagram of an embodiment of an output latch used for the function test of FIG. 7.

The memory itself can be diagnosed by BIST (Built in Self Test) and performance test. When performing a scan test, the memory can be treated as a black box that outputs input data as is, or a constant value. This is shown in FIGS. 7A and 7B. FIG. 7A illustrates the normal operation, while FIG. 7B illustrates a scan. In FIG. 8 an exemplary circuit is shown, which passes through the input data during the test of memory macro-cells. In the circuit shown in FIG. 8, mode signal TEN in high level (logic value 1) indicates a test mode, and TEN in low level (logic value 0) indicates the normal operation. A multiplexer is provided at the output of the output latch of memory to transfer the output signal from the output latch during the normal operation and to select the memory input data during the test mode operation. In this configuration the stored value of the latch is output as output data during the normal operation (FIG. 7A) while the memory input data is passed through during the test mode operation (FIG. 7B).

In a circuit shown in FIG. 8, the delay of the main path increases due to the multiplexer MUX added on the main path of the output latch. As a result the read out time of the memory cells is slowed down in the normal operation, causing the problem of decreasing the operation frequency of the final product. Along with the much larger scale integration, such additional circuits as BIST for LSI diagnosis are imperative. However, for a high-speed LSI, the delay of logic elements, which should fall within the operating cycle of the LSI, does not have enough margin with respect to the operating cycle of the LSI. In this situation the addition of extra circuits such as diagnosis circuit, which have no effect on the primary function of the LSI, increases the logic delay, resulting in a slower speed LSI.

SUMMARY OF THE INVENTION

A principal object of the present invention is to provide a semiconductor integrated circuit device having a diagnosis circuit, which does not complicate the logic delay in normal operation. These and other objects and many of the attendant advantages of the invention will be readily appreciated from the following detailed description considered in conjunction with the accompanying drawings.

An exemplary embodiment in accordance with the disclosed invention may be summarized as follows. In a latch at the output of a memory or at the input of a logic circuit, a signal selector is provided in the feedback loop of the latch so as to switch the operation mode to transmit the feedback signal in the normal operation mode and to feed the test signal in the test mode.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention. In the drawings.

DETAILED DESCRIPTION OF THE PREFERRED EMBODIMENTS

Figure 1:
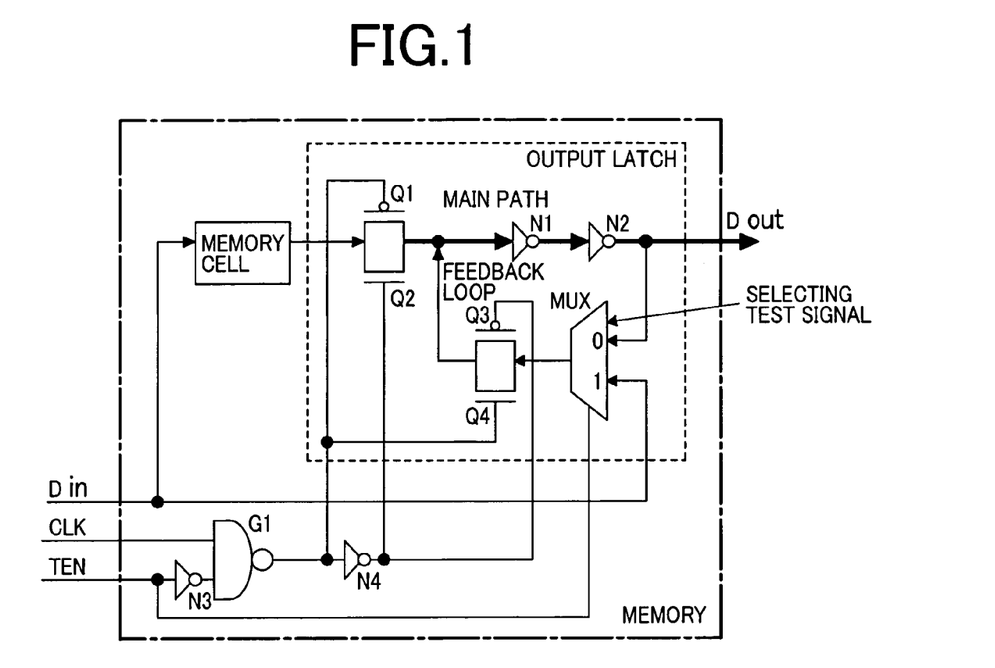
FIG. 1 is a schematic circuit diagram of an embodiment of an output latch equipped in a semiconductor integrated circuit device in accordance with the present invention.

FIG. 1 shows a circuit diagram of a preferred embodiment of the output latch equipped in a semiconductor integrated circuit device in accordance with the present invention. The output latch of this preferred embodiment is to be provided at the output of a memory equipped in the semiconductor integrated circuit device, for performing the collection and retention of read out signal from the memory cell in synchronization with the clock pulse, CLK. The output, Dout, of the output latch is input to a logic as input signal, as will be described below.

In the output latch, the signal Dout is fed through a CMOS switch composed of a p-channel MOSFET Q1 for sending the read out signal from the memory cell, an n-channel MOSFET Q2, then to an inverter N1, and to another inverter N2. In the preferred embodiment, the feedback loop of the output latch is made of a multiplexer MUX having the output signal from the inverter N2 received at one input, and another CMOS switch including a p-channel MOSFET Q3 and an n-channel MOSFET Q4 for transmitting the output signal of the multiplexer MUX.

Input signal, Din, is used for the writing signal to the memory cell, as well as a signal input to the other input of the multiplexer MUX. In the figure, it is indicated that for the sake of simplicity, input signal Din is fed to the memory cell, the signal from which is fed to the output latch as the read out signal. Although simplified in the figure, in the actual memory cells, a plurality of memory cells are made at the intersection of a plurality of word lines and bit lines (or data lines), a selector for the word lines selects a memory cell to read out the stored information for output through an amplifier such as a sense-amp.

In the preferred embodiment, a signal generator for differentiating the operation of the output latch between the normal operation and scan test is provided. The clock pulse CLK is fed to the one of inputs of the NAND gate G1. The other input of the NAND gate G1 accepts a test enable signal, TEN, through an inverter N3. The test enable signal, TEN, is then fed to the multiplexer MUX as the control signal. The output signal of the NAND gate G1 is fed to the gates of the p-channel MOSFET Q1 and n-channel MOSFET Q4, which constitute the above-described CMOS switches. The output signal from the NAND gate G1 is inverted by an inverter N4 to feed to the gates of the n-channel MOSFET Q2 and p-channel MOSFET Q3, which constitute the above-described CMOS switches.

The test enable signal TEN is held low (logical 0) in the normal operation mode, while going high (logical 1) at the time of test mode. As the test enable signal TEN is low in the normal operation, the multiplexer MUX selects the output signal Dout, which corresponds to the logical 0 input. In addition, the gate of the NAND gate G1 is opened to invert the clock signal CLK.

In the normal operation mode, as described above, when the clock pulse CLK is high, the output of the NAND gate goes low, to turn on the CMOS switch (Q1 and Q2) and to turn off the CMOS switch (Q3 and Q4) so that the read out signal from the memory cell is transferred as the output signal, Dout, through the main path made of inverters N1 and N2. When the clock pulse CLK goes from high to low, the output signal of the NAND gate G1 goes high, turning off the CMOS switch (Q1 and Q2), and turning on the CMOS switch (Q3 and Q4) As a result, a feedback loop is formed so as to hold the read out signal from the memory cell in the latch of the inverters N1 and N2.

In the test mode, as the test enable signal, TEN, goes high, the multiplexer MUX selects the input signal, Din, which corresponds to the logical 1 input. Also in the NAND gate G1, the output signal of the inverter N3 goes low by the high level test enable signal, TEN, to close the gate to retain the output signal to high, regardless of the state of clock pulse CLK. When the output signal of the NAND gate G1 is high, the CMOS switch (Q1 and Q2) turns off, and the CMOS switch (Q3 and Q4) turns on. In this state, the input signal, Din, of the memory passes through the multiplexer MUX, the turned-on CMOS switch (Q3 and Q4), and the inverters N1 and N2. In other words the input signal passes through the output latch and is output as the output signal, Dout.

The storage value or the memory input data Din may be output in the normal operation mode and test mode, respectively. In the output latch of the preferred embodiment, since no signal path dedicated for the test is provided on the main path, increased delay may be avoided in the normal operation. In other words, the additional delay potentially caused by the multiplexer MUX shown in the circuit of FIG. 8 is not added, allowing for faster operation in the normal operation mode.

Figure 2:
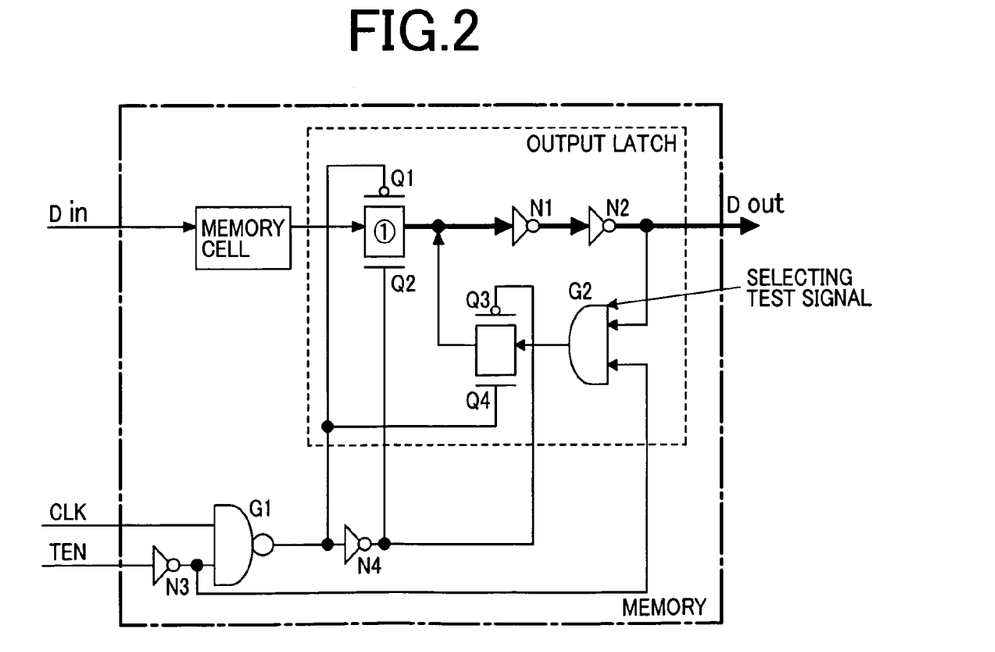
FIG. 2 is a schematic circuit diagram of another embodiment of an output latch equipped in a semiconductor integrated circuit device in accordance with the present invention.

In FIG. 2 another preferred embodiment of the output latch equipped in the semiconductor integrated circuit device in accordance with the present invention is shown. This embodiment indicates a fixed output pin in the test of memory macro-cell. In the embodiment, an AND gate G2 is used instead of the multiplexer MUX of FIG. 1. In this configuration, one of inputs of the AND gate G2 accepts the data output Dout from the inverter N2. The other input of the AND gate G2 is fed with the test enable signal, TEN, passed through the inverter N3. Other components are identical to the embodiment shown in FIG. 1.

In the normal operation mode described above, as test enable signal, TEN, goes low, the output signal of NAND gate G1 is low when the clock pulse CLK is high, to turn on the CMOS switch (Q1 and Q2), and to turn off the CMOS switch (Q3 and Q4), resulting in the read out signal from the memory cell being transmitted as the output signal Dout, through the main path made of the inverters N1 and N2. When the clock pulse CLK goes from high to low, the output signal of the NAND gate G1 goes high, to turn off the CMOS switch (Q1 and Q2) and to turn on the CMOS switch (Q3 and Q4). As a result a feedback loop is formed to retain the read out signal from the memory cell is held in the latch of the inverters N1 and N2.

In the test mode, the test enable signal, TEN, goes high to close the gate of the NAND gate G1 to hold the output signal to high, irrespective of the state of the clock pulse CLK. Since the output signal from the NAND gate G1 is high, CMOS switch (Q1 and Q2) is turned off, and CMOS switch (Q3 and Q4) is turned on. As a result, the high level test enable signal, TEN, is output through the inverter N3, AND gate G2, CMOS switch (Q3 and Q4) that is on, and then through the inverters N1 and N2.

In the present embodiment, the test signal selector composed of an AND gate G2 as above and provided on the feedback loop prevents the delay from increasing in the main path in the normal operation, in a manner similar to the embodiment shown in FIG. 1, while allowing outputting a fixed level signal corresponding to the test enable signal, TEN.

Figure 3:
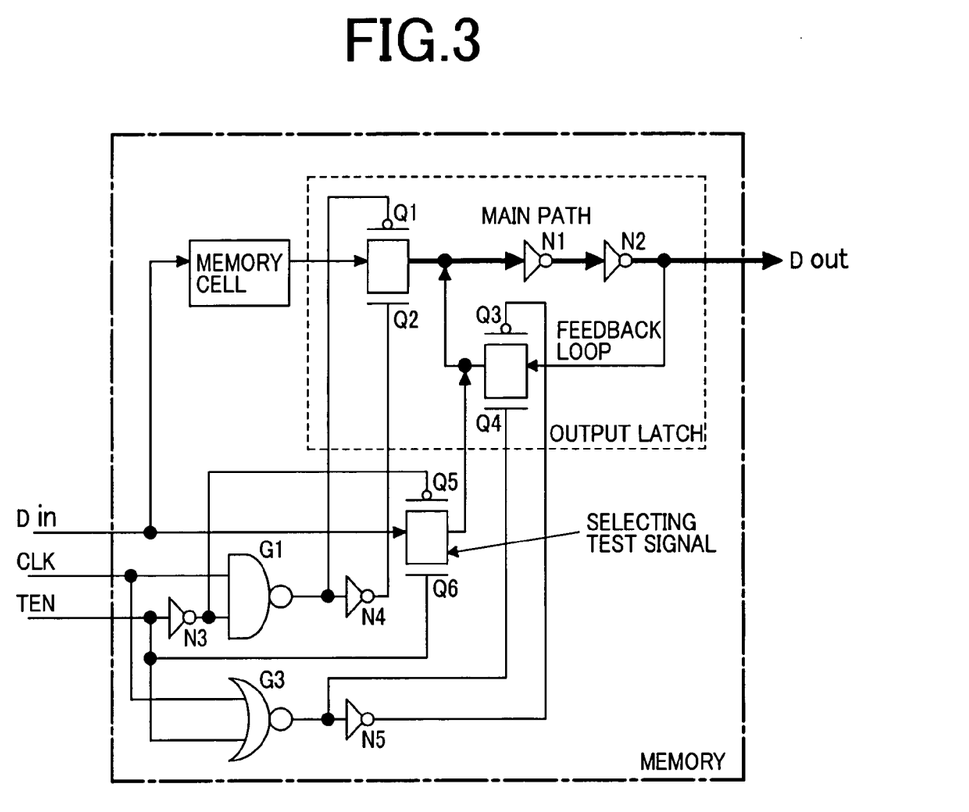
FIG. 3 is a schematic circuit diagram of still another embodiment of an output latch equipped in a semiconductor integrated circuit device in accordance with the present invention.

In FIG. 3, there is shown a circuit diagram of still another embodiment of an output latch equipped in a semiconductor integrated circuit device in accordance with the present invention. This preferred embodiment is a variation of that shown in FIG. 1, which outputs the memory input signal Din as the output signal Dout through the output latch. This embodiment also enables the switching between the CMOS switch for the feedback loop and the CMOS switch for test signal selection. More specifically, a CMOS switch for test signal selection composed of a p-channel MOSFET Q5 and an n-channel MOSFET Q6 is provided.

The above CMOS switch (Q5 and Q6) forms a signal path transmitting the input signal, Din to the input terminal of the inverter N1 in the main path. Although the CMOS switch (Q5 and Q6) is out of the feedback loop, the signal selector between the normal operation and test mode may be in the feedback loop as similar to the preceding embodiments, because the CMOS switch (Q3 and Q4) is required to be off during test mode, as will be described later.

Due to the behavior of the foregoing feedback loop and CMOS switch (Q3 and Q4), the test enable signal, TEN, and the clock pulse CLK are input to a NOR gate G3, the output of which is fed to the gate of the n-channel MOSFET Q4, while the signal inverted by the inverter N4 is fed to the gate of the p-channel MOSFET Q3. The gate of the n-channel MOSFET Q6, which forms the CMOS switch for the test signal selection, receives the test enable signal, TEN, and the gate of the p-channel MOSFET Q5 receives the test enable signal, TEN, inverted by the inverter N3.

In the normal operation mode, as described above, the test enable signal, TEN, goes low to open the gates of the NAND gate G1 and the NOR gate G3, and when the clock pulse CLK is high, the output signal from the NAND gate G1 goes low to turn on the CMOS switch (Q1 and Q2), and the output signal from the NOR gate G3 goes low to turn off the CMOS switch (Q3 and Q4), so that the read out signal from the memory cell is transmitted through the main path of the inverters N1 and N2 to the output Dout.

When the clock pulse CLK goes from high to low, the output signal from the NAND gate G1 becomes high to turn off the CMOS switch (Q1 and Q2), and the output signal from the NOR gate G3 becomes high to turn on the CMOS switch (Q3 and Q4). This forms a feedback loop to hold the read out signal from the memory cell in the latch of the inverters N1 and N2.

In the test mode operation, as described above, the test enable signal, TEN, goes high. This causes the NAND gate G1 to close the gate to hold the output signal to high, regardless of the clock pulse CLK. The NOR gate G3 on the other hand, also closes the gate to hold the output signal to low, regardless of the clock pulse CLK. Since the output from the NAND gate G1 is high, the CMOS switch (Q1 and Q2) is turned off, and since the output from the NOR gate G3 is low the CMOS switch (Q3 and Q4) is turned off. When the test enable signal, TEN, is high, the CMOS switch (Q5 and Q6) turns on to feed the memory input signal Din through the turned-on CMOS switch (Q3 and Q4) and the inverters N1 and N2, i.e., through the output latch to the output Dout.

In this embodiment, the increase of delay in the CMOS switches in the main path and feedback loop during the normal operation mode is prevented by switching the signal input through the CMOS switch (Q5 and Q6) to the feedback loop, while during the test mode input signal, Din, of the memory is passed through to output as Dout.

Figure 4:
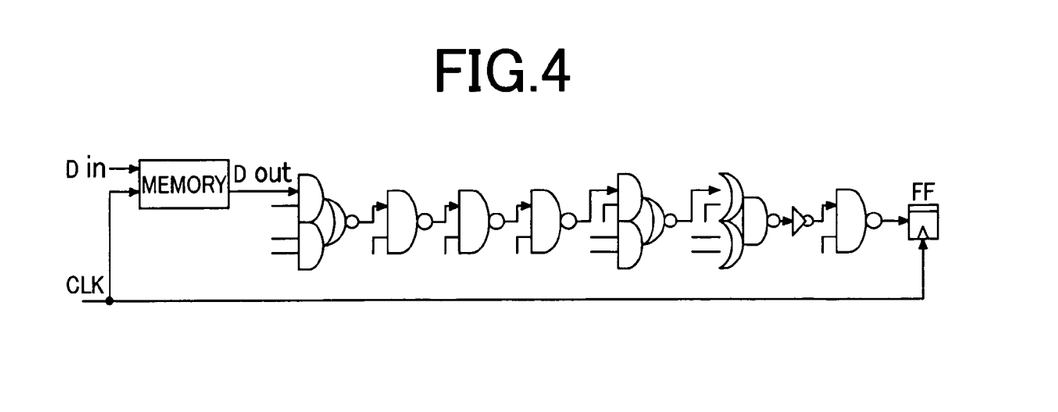
FIG. 4 is a schematic circuit diagram of an embodiment of a memory and a logic stage in a semiconductor integrated circuit device in accordance with the present invention.

FIG. 4 shows a schematic circuit diagram of another preferred embodiment of the memory and logic in the semiconductor integrated circuit device in accordance with the present invention. The semiconductor integrated circuit device of the preferred embodiment forms a single signal path by the memory and the logic stage. In other words the memory is treated as a single logic element in the logic stage composed of a plurality of logic elements (gates). This implies that the memory is considered as a relatively small scaled one.

The digital signal processing circuit controls the operating sequence in synchronization with the clock pulse used as the timing signal. This means that there is a logic element stage provided for logic processing between flip-flop circuits that are signal retention circuits for capturing the input signal in synchronization with the clock pulse. The flip-flop retains a received signal for one clock cycle, so that it is necessary for the logic gate to complete the predetermined logic operation within the retention time to pass it to the input of the following flip-flop.

Assuming that a memory including the output latch shown in FIG. 8 has a signal delay of 2.181 ns, for a digital circuit which has a delay of 4.357 ns for the entire path, including the logic elements as shown, the operating frequency (clock pulse) will be 229 MHz. If the delay in multiplexer MUX provided at the output of the memory is 200 ps, signal delay in the memory can be shortened to 1.981 ns by using the output latch as shown in the preferred embodiment of FIG. 1. As a result, delay for the entire path including the logic elements as shown can be reduced to for example, 4.157 ns. This means that the operating frequency (clock pulse) increases to 241 MHz. The operating frequency can be increased by 12 MHz when applying the present invention.

Figure 5:
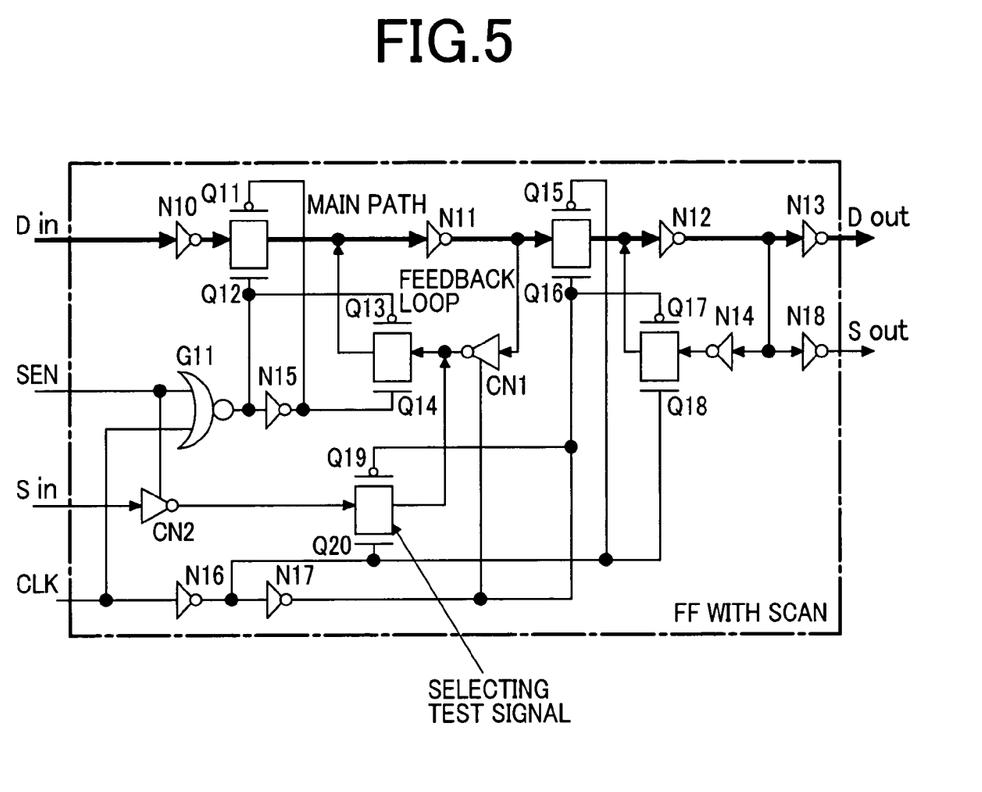
FIG. 5 is a schematic circuit diagram of an embodiment of a flip-flop with scan equipped in a semiconductor integrated circuit device in accordance with the present invention.

FIG. 5 shows a schematic circuit diagram of a preferred embodiment of a flip-flop with scan equipped in the semiconductor integrated circuit device in accordance with the present invention. This embodiment is an exemplary scanned flip-flop made of a flip-flop FF with a circuit for acquiring scan data in the test. Also in this embodiment, CMOS switch is used for the test signal selector, which is placed on the feedback loop in order to prevent the delay in the main path during the normal operation from increasing, as similar to the preceding embodiments.

The flip-flop includes a first latch circuit (first latch) and a second latch circuit (second latch), as well as an output inverter N13. The first latch includes an inverter N10 for receiving input signal Din, a CMOS switch having a p-channel MOSFET Q11 and an n-channel MOSFET Q12 for transferring the output of the inverter N10, an inverter N11 for receiving the signal passed through the CMOS switch, a clocked inverter CN1 for receiving the output from the inverter N11, and another CMOS switch having a p-channel MOSFET Q13 and an n-channel MOSFET Q14 for transferring the output signal of the clocked inverter CN1 to the input terminal of the inverter N11.

In the first latch as above, main path is formed by the inverter N10, the CMOS switch (Q11 and Q12), and the inverter N11; a feedback loop is formed by the clocked inverter CN1 and the CMOS switch (Q13 and Q14).

The second latch includes a CMOS switch having a p-channel MOSFET Q15 and an n-channel MOSFET Q16 for transferring the output signal from the inverter N11 that forms the main path, an inverter N12 for receiving the signal passed through the CMOS switch, an inverter N13 for receiving the output from the inverter N12, another inverter N14 for receiving the output from the inverter N12 and forming inverted signals, and another CMOS switch having a p-channel MOSFET Q17 and an n-channel MOSFET Q18 for transferring the output of the inverter N14 to the input of the inverter N12. The output inverter N13 forms the data output signal Dout upon reception of the output signal from the inverter N12.

A circuit for receiving scan data at the time of test includes the following components and is provided in the feedback loop of the first latch. The scan in signal Sin is fed to the input of a clocked inverter CN2. The output signal of the clocked inverter CN2 is transferred through a CMOS switch having a p-channel MOSFET Q19 and an n-channel MOSFET Q2O to the node between the output of the clocked inverter CN1 of the feedback loop and the CMOS switch (Q13 and Q14). There is also provided an inverter N1B for forming scan out signal Sout upon reception of the output from the inverter N12 of the second latch.

In the scanned flip-flop above, there is also provided a signal generator for performing the normal operation and scan operation. Scan enable signal SEN and clock pulse CLK are fed to a NOR gate G11. The output from the NOR gate G11 is fed to the gate of the n-channel MOSFET Q12 in the CMOS switch in the main path of the first latch, and to the gate of the p-channel MOSFET Q13 of the CMOS switch in the feedback loop.

The output signal of the NOR gate G11 is inverted by an inverter N15 to feed to the gate of the p-channel MOSFET Q11 of the CMOS switch in the main path of the first latch and to the gate of the n-channel MOSFET Q14 of the CMOS switch in the feedback loop. In this configuration the CMOS switch (Q11 and Q12) in the main path of the first latch and the CMOS switch (Q13 and Q14) in the feedback loop are complementarily switched.

The scan enable signal SEN is fed to the clocked inverter CN2. The clocked inverter CN2 is in active operation when the scan enable signal SEN is high, to invert and output the scan in signal Sin. The clocked inverter CN2 is in nonactive operation when the scan enable signal SEN is low to keep the output to high-impedance.

The clock pulse CLK is inverted by an inverter N16 to the gate of the p-channel MOSFET Q15 of the CMOS switch in the main path of the second latch, to the gate of the n-channel MOSFET Q18 of the CMOS switch in the feedback loop, and to the gate of an n-channel MOSFET Q20 of the CMOS switch for test signal selector. An inverter N17 inverts the output of the inverter N16, and the output thereof is fed to the gate of the an n-channel MOSFET Q16 of the CMOS switch in the main path of the second latch, to the gate of the p-channel MOSFET Q17 of the CMOS switch in the feedback loop, to the p-channel MOSFET Q19 of the CMOS switch for the test signal selector and the clocked inverter CN1 of the feedback loop in the first latch.

In normal operation, where the scan enable signal SEN is low, the NOR gate G11 opens its gate to invert and pass the clock pulse CLK. This indicates that when the clock pulse CLK is low, a high level and inverted signal is generated to turn off the p-channel MOSFET Q13 in the feedback loop of the first latch and to turn on the n-channel MOSFET Q12 in the main path of the first latch. The output signal of the inverter N15, receiving the output from the NOR gate G11, goes low to turn off the n-channel MOSFET Q14 that is a part of the feedback loop in the first latch, and to turn on the p-channel MOSFET Q11 in the main path of the first latch. In this state the first latch receives the input signal Din through the inverter N10.

When the clock pulse CLK is low the output from the inverter N16 goes to high to set the output of the inverter N17 to low. In the second latch, on the other hand, the p-channel MOSFET Q15 and the an n-channel MOSFET Q16, both of which form the main path, are turned off while the n-channel MOSFET Q18 and the p-channel MOSFET Q17 in the feedback loop are turned on. In this state the second latch retains the previously fetched output signal of the first latch.

At this time, since the scan enable signal SEN is low, the clocked inverter CN2 is high-impedance output, so as not to fetch the scan in signal Sin. Therefore when the clock pulse CLK goes low, the output of the inverter N16 goes high setting the output of the inverter N17 to low to turn on the n-channel MOSFET Q20 and the p-channel MOSFET Q19, both of which are in the CMOS switch for the test signal selector. However, the first latch, which performs fetch of the input Din, is not affected. The clocked inverter CN1 in the feedback loop of the first latch is also in a high-impedance output state because of low output signal from the inverter N17.

When the clock pulse CLK goes from low to high, the output of the NOR gate G11 is set to low, on the contrary to the above description, the CMOS switch (Q11 and Q12) is turned off and the CMOS switch (Q13 and Q14) is turned on in the first latch. In addition, the clocked inverter CN1 is in active operation so that the feedback loop is created to form a latch of the inverter N1 and the clocked inverter CN1, which retains the signal.

When the clock pulse CLK goes from low to high, the CMOS switch (Q17 and Q18) is turned off in the second latch, on the contrary to the above description, and the CMOS switch (Q15 and Q16) is turned on. The signal retained in the first latch is fetched thereto to form the output signal Dout through the inverter N12 and the output inverter N13. At this time the scan out signal Sout also is output from the inverter N18. However, there will be no problem since the scan input circuit corresponding to the clocked inverter CN2 in the following stage is in inactive. At this time the CMOS switch (Q19 and Q20) for the test signal selection is set to off.

At the timing of clock pulse CLK going low to high, in the normal operation, the output is fed to the logic stage while at the same time the introduction of the input signal Din is interrupted, so that the delay allowed in the logic stage will be the period corresponding to one cycle of clock pulse CLK. More specifically, the acquisition time (setup time) of the input signal in the first latch is subtracted from one cycle of clock pulse CLK, for the delay allowed in the logic stage.

In the test mode operation, the scan enable signal SEN is set to high. The NOR gate G11 in turn will fix its output to low, regardless of the status of clock pulse CLK. In other words, the gate of the NOR gate G11 is closed to keep output signal low. As a result, in the first latch the CMOS switch (Q11 and Q12) in the main path is turned off to stop the acquisition of the input signal Din from the logic stage. Instead the clocked inverter CN2 is active by the high scan enable signal SEN, to allow introducing the scan in signal Sin. In addition, the output signal of the NOR gate G11 going low turns on the CMOS switch (Q13 and Q14) in the feedback loop.

In the test mode operation as described above, if the clock pulse CLK is low, the output of the inverter N16 goes high and the output of the inverter N17 goes low. The low signal of the inverter N17 causes the clocked inverter CN1 in the feedback loop of the first latch to be high-impedance output, and the CMOS switch (Q19 and Q20) for test signal selection to be turned on. In the first latch, the scan in signal Sin is introduced, wherein the scan in signal Sin having passed through the clocked inverter CN2 is input from the feedback loop via the CMOS switch (Q13 and Q14) that is on, to feed to the input of the inverter N11 in the main path.

When the clock pulse CLK is low, similarly to the normal operation, in the second latch, in a similar way to the above-described normal operation, p-channel MOSFET Q15 and the n-channel MOSFET Q16 in the second latch are turned off on the contrary to the first latch, and the n-channel MOSFET Q18 and the p-channel MOSFET Q17 in the feedback loop of the second latch is turned on. By doing this, the second latch retains the previously obtained output signal from the first latch.

When the clock pulse CLK goes from low to high, the CMOS switch (Q19 and Q20) for the test signal selection in the first latch is turned off activating the clocked inverter CN1. This creates the feedback loop to form a latch between the inverter N11 and the clocked inverter CN1 to retain the previously obtained scan in signal Sin.

When the clock pulse CLK goes from low to high, the CMOS switch (Q17 and Q18) in the second latch is turned off in a similar way to the above-described normal operation and the CMOS switch (Q15 and Q16) is turned on. In this state the signal retained in the first latch is captured to output the scan out signal Sout through the inverter N12 and the inverter N14. Although the data output signal Dout is also output from the output inverter N13 to the logic stage, there will be no problem since the data input signal Din corresponding thereto will not be introduced to the first latch.

In the test mode operation, as have been described above, at the timing of rising of the clock pulse CLK, the scan out signal is transferred to the logic stage while at the same time the introduction of the scan in signal Sin is stopped, so that the test input signal is serially introduced to the flip-flop with scan, which is connected in a daisy-chain.

In this embodiment, the test signal selector circuit is added to the flip-flop with scan, the test signal selector being provided in the feedback loop of the latch. In this way the delay of the main path in the normal operation mode will not be degraded. The increase of delay of the logic elements in the normal operation mode can be avoided even if the test signal selector is added to the latch, so that a faster operation can be achieved.

More precisely, in a flip-flop with scan, the setup time of input signal Din transferred from the logic stage can be shortened by preventing the delay on the main path of the first latch from deteriorating, and not by avoiding the delay of signal timing of input to the logic stage like the memory output latch. As a result, the operating frequency can be increased similar to the case of the output latch. If the method in accordance with the present invention is not applied to the flip-flop with scan, the operating frequency will be decreased by the increase of setup time when adding a test circuit. By applying the present invention the operating frequency can be increased while adding a test circuit having a flip-flop with scan.

Figure 6:
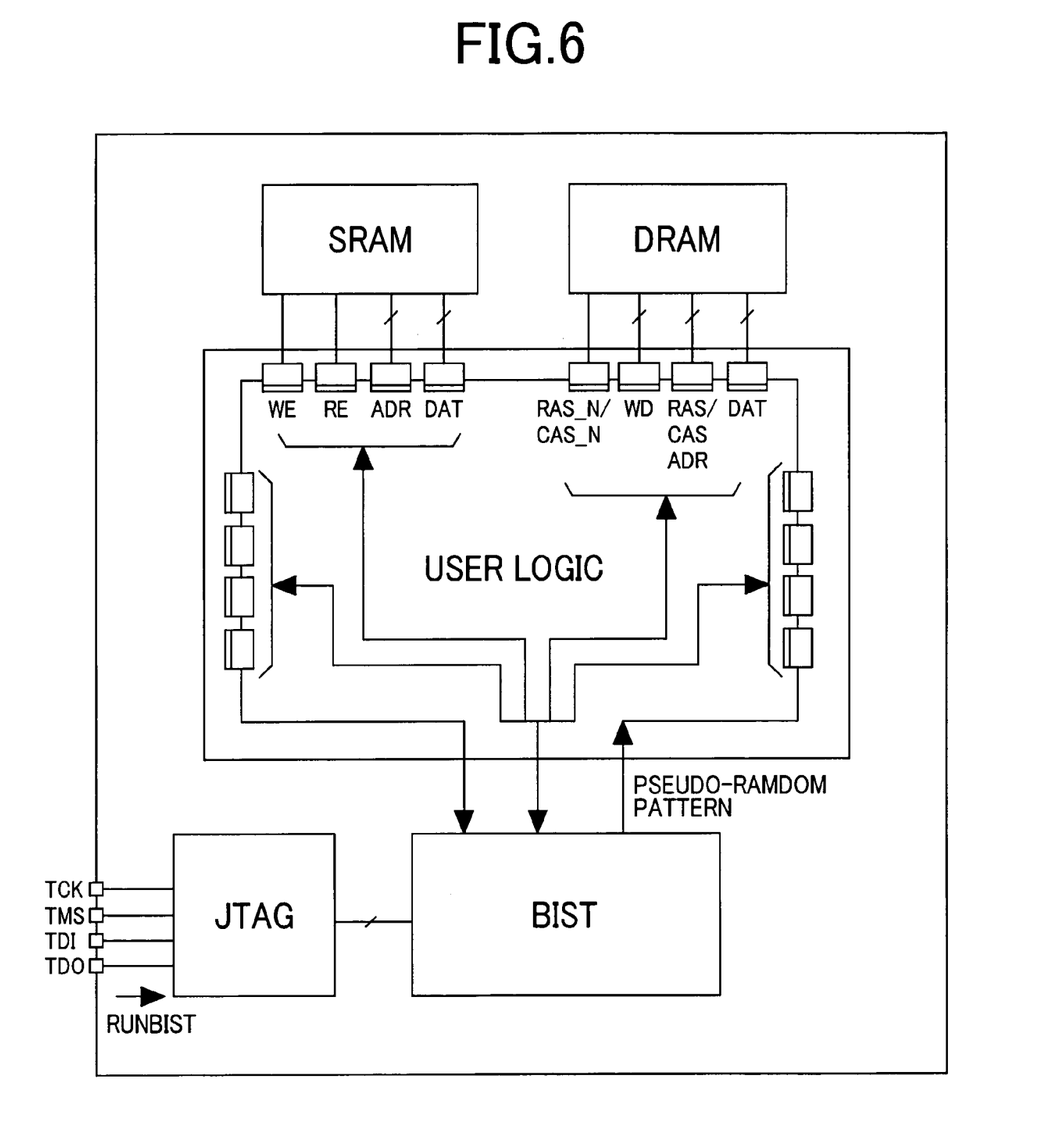
FIG. 6 is a schematic block diagram of an embodiment of a semiconductor integrated circuit device in accordance with the present invention.

FIG. 6 shows an overview of an embodiment of the semiconductor integrated circuit device in accordance with the present invention. The semiconductor integrated circuit device of this embodiment includes, but not is limited to, a DRAM (dynamic RAM), SRAM (static RAM), User Logic for controlling the RAMs, a test circuit BIST, and an interface JTAG. The interface circuit JTAG may input-output in serial the test mode setting signal TMS and test input data TDI as well as test output data TDO, in synchronization with the clock terminal TCK.

DRAM may have, and is not limited to, a large scaled DRAM core such as 64K words by 288 bits (approximately 18.4 M bits), four registers each having a storage of 72 bits for writing to the DRAM core, and four registers each having a storage of 72 bits for reading out from the DRAM core.

SRAM may have the role of a buffer register for I/O operation of the DRAM and four writing ports each having 128 words by 72 bits, and four reading ports each having 128 words by 72 bits but is not limited thereto. The user logic is made of I/O interface for input/output in 72 bit units, a multiplexer MUX for transferring data of 72 bits between the SRAM and DRAM, and so on.

The test circuit BIST has a MUX-SCAN path, for feeding serially a test pattern to the latch that forms a register by connecting in a daisy-chain to the user logic, and for sending control signal in parallel to the user logic and to the DRAM and SRAM. The DRAM, SRAM and the user logic may operate their internal circuits based on the test pattern fed from the test circuit BIST in the operation mode of MUX-SCAN when necessary, so as to each diagnose independently.

In the user logic above, there is a logic stage for receiving the read out signal from the memory of relatively small storage capacity, which is different from the relatively large scaled memory such as the DRAM and SRAM above, in the normal operation mode as shown in FIG. 7A, so it will be necessary to feed an input signal passed through the memory or constant signal as the test signal to the logic stage, in the test mode operation, as shown in FIG. 7B. The latches shown in FIG. 1, 2 or 3 are provided for the generation of the pass-through input signal or constant signal.

The above-described DRAM and SRAM of relatively large-scaled storage capacity can be used for the memory. However, when equipped as a part of the signal path as shown in FIG. 4, the delay (memory access time) will be unacceptably long. The DRAM and SRAM in accordance with the preferred embodiment may require consuming a plurality of clock cycles for their respective memory access. Latches forming a register in a daisy-chain in the figure allows input signal (address and data) for there independent memory access to feed and the read out signal a few clock cycles after will be received by the latches and collected through the chain.

It is to be understood that the present invention is not to be limited to the details herein given but may be embodied in other specific forms without departing from the spirit or essential characteristics thereof. For instance, the clocked inverters CN1 and CN2 may have elements other than switching MOSFET for feeding operation voltage in synchronization with the clock pulse to the inverters, for example CMOS switches provided at the output of inverters to generate high-impedance output. The configuration of switching test signal input to the feedback loop of the latches may be embodied in other forms as well. The test enable signal TEN and scan enable signal SEN can be the same signal. The present invention may be applied to a variety of semiconductor integrated circuit devices having a test circuit.

The effect primarily provided by the present invention may be summarized as follows. The latch at the output of a memory or at the input of a logic stage may have a signal selector in a feedback loop of the latches so as to switch the signal selector in correspondence with the operation mode such that it passes the feedback signal in the normal operation mode and receives the test signal in the test mode operation in order to prevent the delay in the signal selector on the main path from increasing in the normal operation mode to achieve a faster operation.

What is claimed is:

1. A semiconductor integrated circuit device, comprising:
a latch provided on an output of a memory circuit;
wherein said latch includes a signal selector for switching between feedback signal of normal operation and test signal of test operation in compliance with an operation mode signal to send out to a feedback loop;
wherein said latch has a first switch for sending a read-out signal from a memory cell in said memory circuit to an input terminal of a first inverter under control of a switch control signal, a second inverter for receiving an output signal of said first inverter on an input terminal, and a second switch for sending an output signal of said second inverter to the input terminal of said first inverter under control of said switch control signal, and said latch outputs a latch output signal from an output terminal of said second inverter;
said signal selector has a third switch for sending an input signal fed to said memory circuit to the input terminal of said first inverter as the test signal under control of said switch control signal, and a signal generator for generating said switch control signal; and
said signal generator turns off said third switch in the normal operation by said operation mode signal to perform a complementary switching control of said first and second switches by using clock pulses as said switch control signal, and turns off said first and second switches and turns on said third switch in the test operation by said operation mode signal.

2. A semiconductor integrated circuit device, comprising:

a latch provided on an input of a logic circuit;

wherein said latch includes a signal selector for switching between feedback signal of normal operation and test signal of test operation in compliance with an operation mode signal to send out to a feedback loop;

said latch includes a first latch for receiving an input signal in the normal operation and a second latch for generating the signal input to said logic circuit upon reception of an output from said first latch;

said signal selector is provided in a feedback loop of said first latch;

said first latch has a first switch for sending said input signal to an input terminal of a first inverter under control of a switch control signal, a first clocked inverter for receiving an output signal from said first inverter on an input terminal under control of clock pulses, and a second switch for sending an output signal from said first clocked inverter to the input terminal of said first inverter under control of said switch control signal;

said second latch has a circuit under control of said clock pulses for performing signal collection and signal retention in complementary relation to said first latch, a second inverter for generating an output signal to the input of said logic circuit, and a third inverter for generating an output signal for test scan;

said signal selector has a second clocked inverter under control of said switch control signal for receiving a test input signal on an input terminal, a third switch for sending an output signal from said second clocked inverter to an input of said second switch under control of said clock pulses, and a signal generator for generating said switch control signal;

said signal generator turns off said second clocked inverter by said operation mode signal during the normal operation, passing said clock pulses to said first and second switches as said switch control signal, in order to perform the complementary operation of signal collection and signal retention in response to the input signal by the first and second latches; and said signal generator turns off said first switch and turns on said second switch during the test mode in accordance with said operation mode signal, in order to perform the complementary operation of signal collection and signal retention by the first and second latches in response to the test input signal passing through said second clocked inverter.

* * * * *